(12) United States Patent
Miller et al.

(10) Patent No.: US 11,554,752 B2
(45) Date of Patent: Jan. 17, 2023

(54) WAVETRAP FOR A VEHICLE DEFROSTER SYSTEM

(71) Applicant: TE CONNECTIVITY CORPORATION, Berwyn, PA (US)

(72) Inventors: Alan W. Miller, Milan, MI (US); Ioan Stan, Bloomfield Hills, MI (US); Yassine Borkadi, Ann Arbor, MI (US)

(73) Assignee: TE Connectivity Solutions GmbH

( * ) Notice: Subject to any disclaimer, the term of this patent is extended or adjusted under 35 U.S.C. 154(b) by 565 days.

(21) Appl. No.: 16/558,516

(22) Filed: Sep. 3, 2019

(65) Prior Publication Data

US 2021/0061227 A1    Mar. 4, 2021

(51) Int. Cl.
| | | |
|---|---|---|
| *H01Q 1/32* | (2006.01) | |
| *B60R 16/023* | (2006.01) | |
| *B60S 1/02* | (2006.01) | |
| *H05B 3/03* | (2006.01) | |
| *B60R 16/033* | (2006.01) | |
| *H03H 1/00* | (2006.01) | |
| *H01Q 1/12* | (2006.01) | |

(52) U.S. Cl.
CPC ............ *B60S 1/026* (2013.01); *B60R 16/033* (2013.01); *H05B 3/03* (2013.01); *H01Q 1/1278* (2013.01); *H03H 1/00* (2013.01)

(58) Field of Classification Search
None
See application file for complete search history.

(56) References Cited

U.S. PATENT DOCUMENTS

| | | | | | |
|---|---|---|---|---|---|
| 5,548,298 | A | * | 8/1996 | Nakase | ............... H01Q 1/1278 343/704 |
| 5,610,619 | A | * | 3/1997 | Zafar | .................. H01Q 1/1271 343/704 |
| 5,883,599 | A | * | 3/1999 | Hall | ...................... H01Q 21/28 343/713 |
| 5,907,308 | A | * | 5/1999 | Oka | ..................... H01Q 1/1278 343/713 |
| 6,064,345 | A | * | 5/2000 | Ohnishi | .............. H01Q 1/1278 343/704 |

(Continued)

FOREIGN PATENT DOCUMENTS

| | | | | | |
|---|---|---|---|---|---|
| JP | | 58116802 A | * | 7/1983 | .......... H01Q 1/1278 |
| JP | 2007295403 A | | * | 11/2007 | |

OTHER PUBLICATIONS

JPS58-116802A, Tomoma et al., Jul. 1993, "Antfogging Glass and Antenna Device," partial translation (Year: 1993).*

*Primary Examiner* — Joseph M. Pelham (57) ABSTRACT

A wavetrap includes a housing having a base including a base plate. The housing has a wire channel, an inductor pocket and a terminal pocket. The housing has a capacitor pocket that receives a capacitor. The wavetrap includes a defroster wire having a wire end received in the wire channel. The defroster wire extends from the housing for connection to a vehicle defroster circuit. The wavetrap includes an inductor supported by the base plate. The inductor is received in the inductor pocket. The inductor has a coil extending between a first end and a second end. The first end is coupled to the wire end of the defroster wire. The wavetrap includes a ground terminal supported by the base plate. The ground terminal is received in the terminal pocket. The ground terminal is electrically connected to a ground circuit.

20 Claims, 8 Drawing Sheets

(56) References Cited

U.S. PATENT DOCUMENTS

| | | | | |
|---|---|---|---|---|
| 2001/0054982 | A1* | 12/2001 | Tabata | H01Q 1/1278 |
| | | | | 343/713 |
| 2004/0070544 | A1* | 4/2004 | Prassmayer | H01Q 1/1278 |
| | | | | 343/704 |
| 2005/0202794 | A1* | 9/2005 | Mayr | H05K 7/02 |
| | | | | 455/193.1 |
| 2006/0012532 | A1* | 1/2006 | Baba | H01Q 1/1278 |
| | | | | 343/713 |
| 2009/0195341 | A1* | 8/2009 | Rokuka | H01Q 1/1278 |
| | | | | 336/65 |
| 2012/0081194 | A1* | 4/2012 | Nishioka | H01F 27/40 |
| | | | | 333/185 |
| 2015/0296298 | A1* | 10/2015 | Yamada | H03H 1/0007 |
| | | | | 381/71.1 |
| 2017/0093360 | A1* | 3/2017 | Itou | H01B 7/0045 |

* cited by examiner

WAVETRAP FOR A VEHICLE DEFROSTER SYSTEM

BACKGROUND OF THE INVENTION

The subject matter herein relates generally to a wavetrap system for a vehicle.

Vehicles, such as automobiles, include rear window defroster systems that are used to defrost the rear window of the vehicle. The rear window defroster system includes a heater grid of wires across the rear window. The rear window defroster system includes a positive side coupled to a positive power supply of a battery of the vehicle and a negative side that is electrically grounded. Some vehicles utilize the heater grid of wires as an antenna circuit. Such vehicles use a wavetrap system to electrically isolate the vehicle defroster circuit from the battery or other electrical systems of the vehicle. The wavetrap system includes a positive side wavetrap and a negative side wavetrap. The positive side wavetrap includes different components than the negative side wavetrap, leading to design of two completely different components, which increases the overall cost of the wavetrap system.

A need remains for a cost effective and reliable wavetrap system for a vehicle defroster system.

BRIEF DESCRIPTION OF THE INVENTION

In one embodiment, a wavetrap is provided. The wavetrap includes a housing having a base including a base plate. The housing has a wire channel, an inductor pocket and a terminal pocket. The housing has a capacitor pocket that receives a capacitor. The wavetrap includes a defroster wire having a wire end received in the wire channel. The defroster wire extends from the housing for connection to a vehicle defroster circuit. The wavetrap includes an inductor supported by the base plate. The inductor is received in the inductor pocket. The inductor has a coil extending between a first end and a second end. The first end is coupled to the wire end of the defroster wire. The wavetrap includes a ground terminal supported by the base plate. The ground terminal is received in the terminal pocket. The ground terminal is electrically connected to a ground circuit.

In another embodiment, a wavetrap system is provided. The system includes a plus wavetrap that is configured to be electrically connected to a positive side of a vehicle defroster circuit and a minus wavetrap that is configured to be electrically connected to a negative side of the vehicle defroster circuit. The plus wavetrap includes a first housing having a first base including a first base plate. The first housing has a first wire channel, a first inductor pocket, a first terminal pocket and a first capacitor pocket. The plus wavetrap includes a first defroster wire having a wire end received in the first wire channel. The first defroster wire extends from the first housing for connection to the positive side of the vehicle defroster circuit. The plus wavetrap includes a first inductor received in the first inductor pocket. The first inductor has a first coil that extends between a first end and a second end. The first end of the first coil is coupled to the wire end of the first defroster wire. The plus wavetrap includes a first battery terminal received in the first terminal pocket. The first battery terminal is electrically connected to a battery. The second end of the first coil is terminated to the first battery terminal. The plus wavetrap includes a first ground terminal received in the first terminal pocket. The first ground terminal is electrically connected to a ground circuit. The plug wavetrap includes a first capacitor received in the first capacitor pocket. The first capacitor is electrically connected to the first battery terminal. The first capacitor is electrically connected to the first ground terminal. The minus wavetrap includes a second housing having a second base including a second base plate. The second housing has a second wire channel, a second inductor pocket, a second terminal pocket, and a second capacitor pocket. The minus wavetrap includes a second defroster wire having a wire end received in the second wire channel. The second defroster wire extends from the second housing for connection to the negative side of the vehicle defroster circuit. The minus wavetrap includes a second inductor received in the second inductor pocket. The second inductor has a second coil extending between a first end and a second end. The first end of the second coil is coupled to the wire end of the second defroster wire. The minus wavetrap includes a second ground terminal received in the second terminal pocket. The second ground terminal is electrically connected to a ground circuit.

In a further embodiment, a vehicle defroster system is provided. The vehicle defroster system includes a vehicle defroster circuit having a positive circuit at a positive side of the vehicle defroster circuit and a negative circuit at a negative side of the vehicle defroster circuit. The vehicle defroster system includes a plus wavetrap electrically connected to the positive side of a vehicle defroster circuit. The plus wavetrap includes a first housing having a first base including a first base plate. The first housing has a first wire channel, a first inductor pocket, a first terminal pocket, and a first capacitor pocket. The plus wavetrap includes a first defroster wire having a first wire end received in the first wire channel. The first defroster wire extends from the first housing for connection to the positive side of the vehicle defroster circuit. The plus wavetrap includes a first inductor received in the first inductor pocket. The first inductor has a first coil extending between a first end and a second end. The first end of the first coil is coupled to the first wire end of the first defroster wire. The plus wavetrap includes a first ground terminal received in the first terminal pocket. The first ground terminal is electrically connected to a ground circuit. The vehicle defroster system includes a minus wavetrap electrically connected to the negative side of the vehicle defroster circuit. The minus wavetrap includes a second housing having a second base including a second base plate. The second housing has a second wire channel, a second inductor pocket, a second terminal pocket, and a second capacitor pocket. The minus wavetrap includes a second defroster wire having a second wire end received in the second wire channel. The second defroster wire extends from the second housing for connection to the positive side of the vehicle defroster circuit. The minus wavetrap includes a second inductor received in the second inductor pocket. The second inductor has a second coil extending between a first end and a second end. The second end of the second coil is coupled to the second wire end of the second defroster wire. The minus wavetrap includes a second ground terminal received in the second terminal pocket. The second ground terminal is electrically connected to a ground circuit.

DETAILED DESCRIPTION OF THE INVENTION

Figure 1:
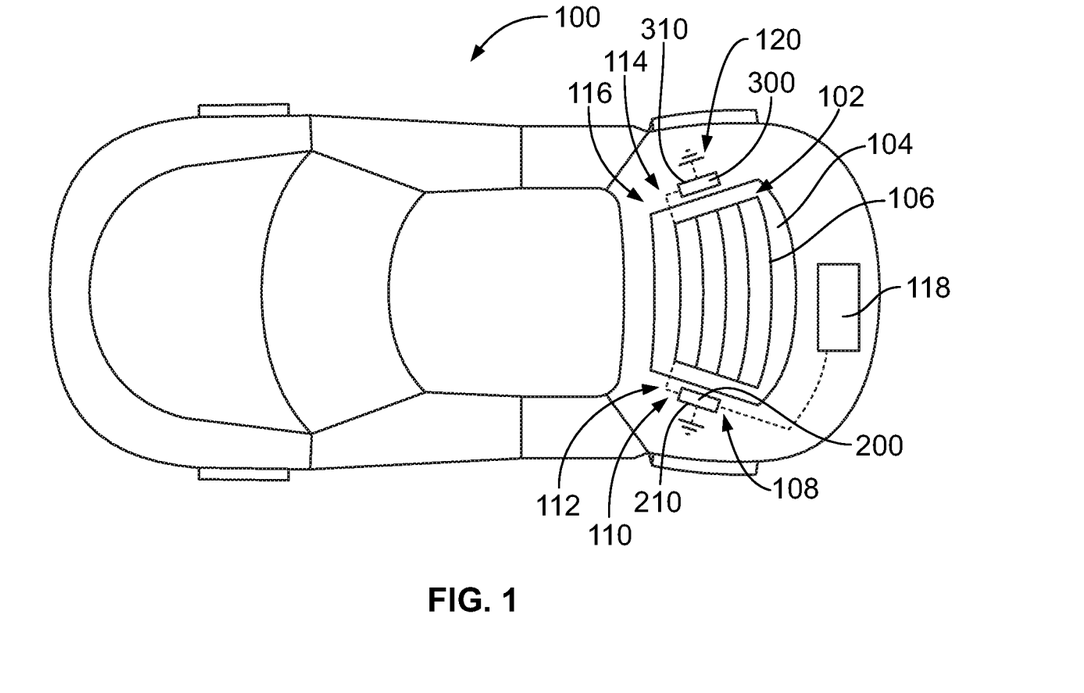
FIG. 1 illustrates a vehicle having a vehicle defroster system in accordance with an exemplary embodiment.

FIG. 1 illustrates a vehicle 100 having a vehicle defroster system 102 in accordance with an exemplary embodiment. The vehicle defroster system 102 is provided at a rear window 104 of the vehicle 100. The vehicle defroster system 102 includes a plurality of heater elements 106 spanning across the rear window 104. The heater elements 106 are electrically connected to a vehicle defroster circuit 108 of the vehicle defroster system 102. The vehicle defroster circuit 108 is activated to heat up the heater elements 106, such as with resistance heating, to defroster the rear window 104. The vehicle defroster circuit 108 includes a positive circuit 110 at a positive side 112 of the vehicle defroster circuit 108 and a negative circuit 114 at a negative side 116 of the vehicle defroster circuit 108. In various embodiments, the positive circuit 110 includes a busbar electrically connected to the heater elements 106 at the positive side 112 and the negative circuit 114 includes a busbar electrically connected to the heater elements 106 at the negative side 116.

In an exemplary embodiment, the vehicle defroster circuit 108 is electrically connected to a battery 118 of the vehicle 100. The battery 118 supplies power to the vehicle defroster circuit 108. In an exemplary embodiment, the vehicle 100 includes a wavetrap system 120 used to electrically isolate the vehicle defroster circuit 108, such as the heater element 106, from the battery 118 or other electrical systems of the vehicle 100. The wavetrap system 120 allows the use of the conductors of the vehicle defroster circuit 108 for radio reception purposes. For example, in an exemplary embodiment, the vehicle defroster circuit 108 is used as an antenna for the vehicle 100, such as an FM antenna and/or an AM antenna. The wavetrap system 120 reduces interference from the vehicle defroster circuit 108.

In an exemplary embodiment, the wavetrap system 120 includes a plus wavetrap 200 electrically connected to the positive side 112 of the vehicle defroster circuit 108 and a minus wavetrap 300 electrically connected to the negative side 116 of the vehicle defroster circuit 108. The plus wavetrap 200 includes a housing 210 holding components configured to be electrically connected to the positive circuit 110 of the vehicle defroster circuit 108 and configured to be electrically connected to the battery 118. The plus wavetrap 200 may be connected to the positive circuit 110 and the battery 118 by wires, pluggable electrical connections, or by other types of electrical connections. The minus wavetrap 300 includes a housing 310 holding components configured to be electrically connected to the negative circuit 114 of the vehicle defroster circuit 108. The minus wavetrap 300 may be connected to the negative circuit 114 by wires, pluggable electrical connections, or by other types of electrical connections.

Figure 2:
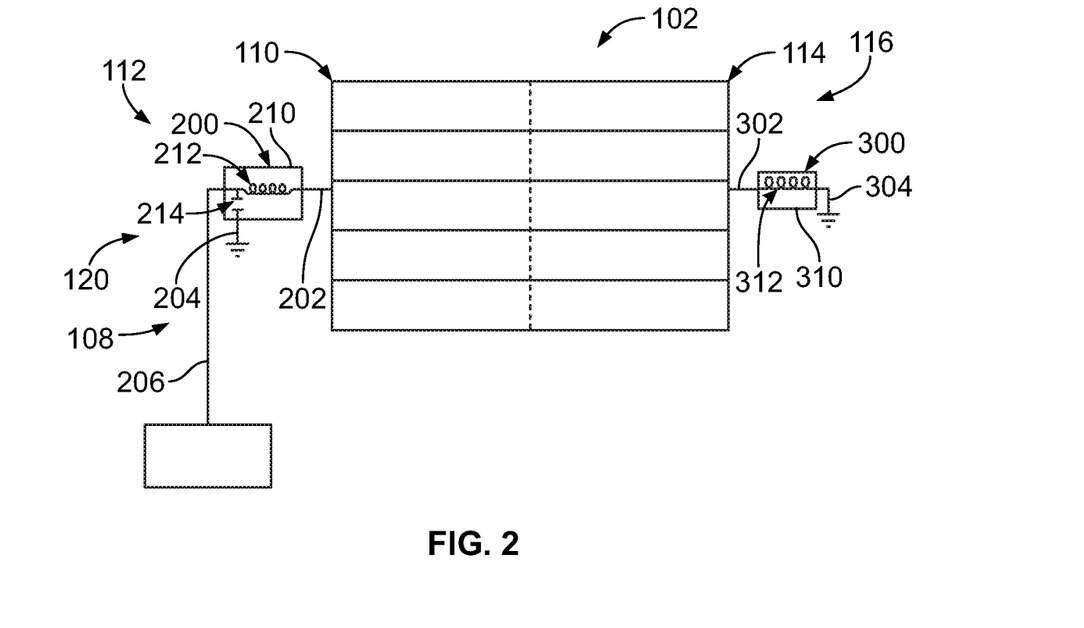
FIG. 2 is a schematic view of a wavetrap system for the vehicle defroster system in accordance with an exemplary embodiment.

FIG. 2 is a schematic view of the wavetrap system 120 and the vehicle defroster system 102 in accordance with an exemplary embodiment. In an exemplary embodiment, the plus wavetrap 200 is provided at a supply at the positive side 112 to the positive circuit 110 of the vehicle defroster circuit 108. The minus wavetrap 300 is provided at a supply at the negative side 116 to the negative circuit 114 of the vehicle defroster circuit 108.

The plus wavetrap 200 includes a defroster conductor 202 configured to be coupled to the positive circuit 110 of the vehicle defroster circuit 108. The plus wavetrap 200 includes a ground conductor 204 configured to be electrically grounded. The plus wavetrap 200 includes a battery conductor 206 configured to be electrically connected to the battery 118. The defroster conductor 202 and/or the ground conductor 204 and/or the battery conductor 206 may include an electrical wire in various embodiments. The defroster conductor 202 and/or the ground conductor 204 and/or the battery conductor 206 may include a pluggable electrical connector in various embodiments. The defroster conductor 202 and/or the ground conductor 204 and/or the battery conductor 206 may include a screw terminal connector in various embodiments.

The housing 210 holds and/or receives the defroster conductor 202, the ground conductor 204 and the battery conductor 206. The housing 210 holds an inductor 212 configured to be electrically connected to the defroster conductor 202 and the battery conductor 206. The housing 210 holds at least one capacitor 214 configured to be electrically connected to the ground conductor 204 and the battery conductor 206. In an exemplary embodiment, the housing 210 holds a high-frequency capacitor, such as for an FM antenna, and a low-frequency capacitor, such as for an AM antenna.

The minus wavetrap 300 includes a defroster conductor 302 configured to be coupled to the negative circuit 114 of the vehicle defroster circuit 108. The minus wavetrap 300 includes a ground conductor 304 configured to be electrically grounded. The defroster conductor 302 and/or the ground conductor 304 may include an electrical wire in various embodiments. The defroster conductor 302 and/or the ground conductor 304 may include a pluggable electrical connector in various embodiments. The defroster conductor 302 and/or the ground conductor 304 may include a screw terminal connector in various embodiments.

The housing 310 holds and/or receives the defroster conductor 302 and the ground conductor 304. The housing 310 holds an inductor 312 configured to be electrically connected to the defroster conductor 302 and the ground conductor 304. In an exemplary embodiment, the housing 310 is identical to the housing 210 such that the same housing structure can be used for the plus wavetrap 200 or the minus wavetrap 300 to reduce cost and complexity of the wavetrap system 120. The housing 310 may be manufactured using the same mold as the housing 210. The housing 310 may include a space to hold a capacitor even though the minus wavetrap housing 310 is devoid of any capacitor. The housings 210, 310 include locating features to guide and position the components of the wavetraps 200, 300 within the housings 210, 310. In an exemplary embodiment, the inductor 312 is identical to the inductor 212 such that the same inductor structure can be used for the plus wavetrap 200 or the minus wavetrap 300 to reduce cost and complexity of the wavetrap system 120. In an exemplary embodiment, other components of the wavetraps 200, 300 may be identical, such as wires, terminals, and the like, such that the same components can be used for the plus wavetrap 200 or the minus wavetrap 300 to reduce cost and complexity of the wavetrap system 120. Utilizing identical components throughout the wavetrap system 120 reduces part count and tooling cost of producing the wavetrap system 120.

Figure 3:
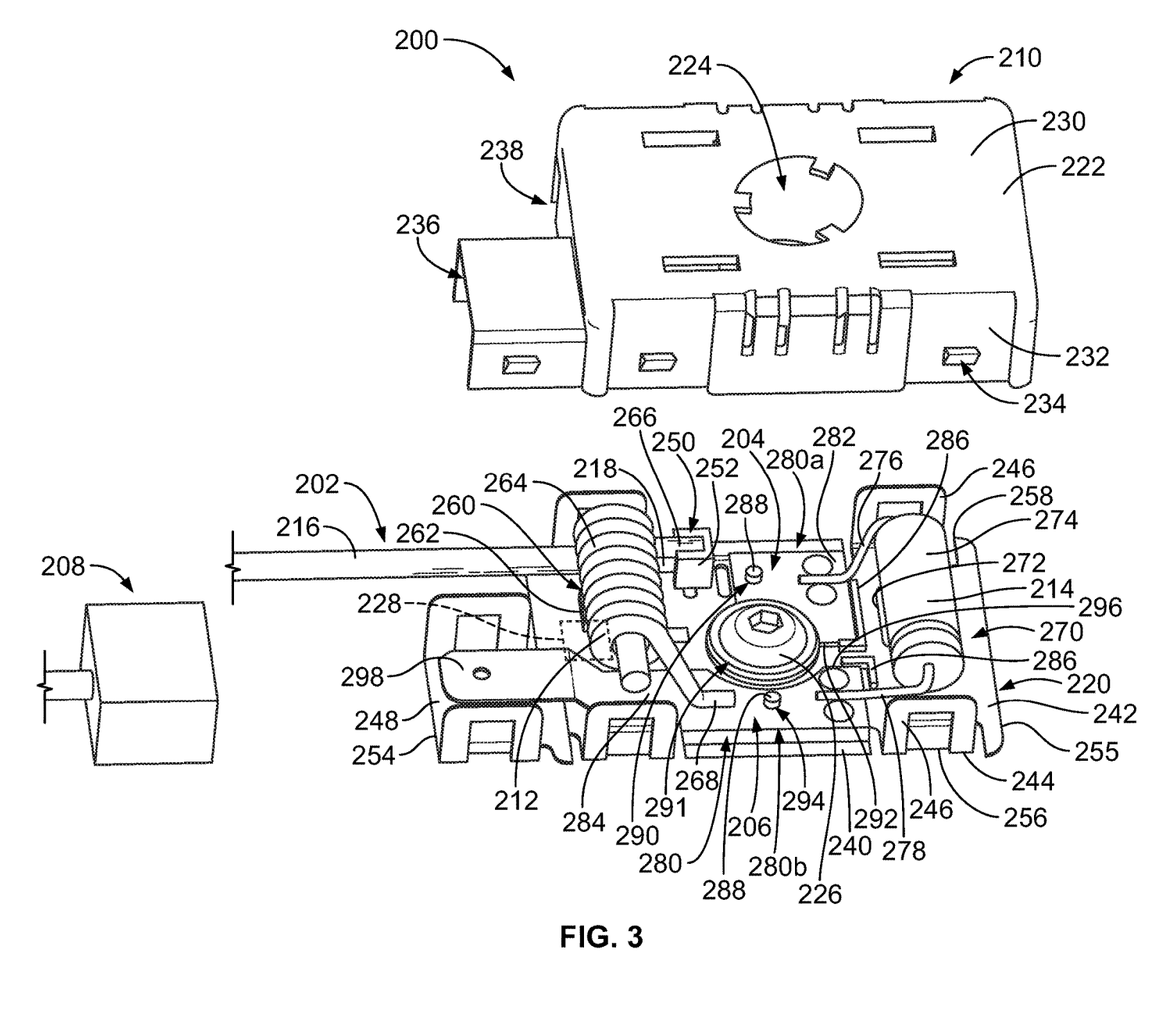
FIG. 3 is a partially exploded perspective view of a wavetrap of the wavetrap system in accordance with an exemplary embodiment.

FIG. 3 is a partially exploded perspective view of the plus wavetrap 200 in accordance with an exemplary embodiment showing an electrical connector 208 configured to be connected to the plus wavetrap 200. The wavetrap 200 includes the housing 210 holding various components of the wavetrap system. In an exemplary embodiment, the housing 210 is a multi-piece housing having a base 220 and a cover 222 configured to be coupled to the base 220. The base 220 holds components of the wavetrap 200. The cover 222 includes a cavity 224 that receives the components of the wavetrap 200 when the cover 222 is coupled to the base 220. The base 220 is configured to be mounted to a mounting structure using a fastener 226, such as a threaded fastener; however, the base may be secured to the mounting structure by other means, such as adhesive, clips or other types of fasteners. In various embodiments, the base 220 includes a mounting clip 228 (shown in phantom, also shown in FIG. 7) for locating and/or securing the base 220 to the mounting structure.

The cover 222 includes a top 230 and side walls 232 extending from the top 230. The cavity 224 is defined by the top 230 and the side walls 232. The cavity 224 is open at the bottom of the cover 222. In an exemplary embodiment, the side walls 232 include latching features 234 for latchably securing the cover 222 to the base 220. In the illustrated embodiment, the latching features 234 include latches extending outward from the side walls 232 having ramp surfaces and catch surfaces for securing the cover 222 to the base 220. Other types of latching features may be used in alternative embodiments. In an exemplary embodiment, the cover 222 includes a connector port 236 for receiving the electrical connector 208. The connector port 236 provides access to the cavity 224. The connector port 236 provides access to components of the wavetrap 200. In the illustrated embodiment, the connector port 236 is provided near a front of the cover 222. In an exemplary embodiment, the cover 222 includes one or more wire ports 238 to receive wires of the wavetrap 200. For example, wires may extend into or out of the cavity 224 through the wire ports 238. The wire ports 238 may be open at the bottom of the cover 222.

The base 220 includes a base plate 240 having a top 242 and a bottom 244. The base plate 240 may be generally planar in various embodiments. The base 220 may include features extending from the base plate 240, such as for locating or securing various components of the wavetrap 200 to the base plate 240. The bottom 244 is configured to be mounted to the supporting structure. The components of the wavetrap 200 are mounted to the top 242 of the base plate 240. The base plate 240 positions and holds the components of the wavetrap 200. In an exemplary embodiment, the base 220 includes latching features 246 extending from the base plate 240. The latching features 246 interface with the latching features 234 of the cover 222 to secure the cover 222 to the base 220. In the illustrated embodiment, the latching features 246 are deflectable latching tabs or clips. Other types of latching features may be used in alternative embodiments. In an exemplary embodiment, the base plate 240 includes a mating pad 248. The mating pad 248 is an extension configured to be mated with another component, such as the electrical connector 208. In the illustrated embodiment, the mating pad 248 is aligned with the connector port 236 of the cover 222 to receive the electrical connector 208.

In an exemplary embodiment, the wavetrap 200 includes a defroster wire 216 extending into the housing 210. In the illustrated embodiment, the defroster wire 216 defines the defroster conductor 202 of the wavetrap 200. The defroster wire 216 extends to a wire end 218. The wire end 218 is terminated to the inductor 212. For example, the wire end 218 may be soldered, crimped, or otherwise electrically connected to the inductor 212. In an exemplary embodiment, the housing 210 includes a wire channel 250 receiving the wire end 218 of the defroster wire 216. The wire channel 250 is formed by support walls 252 extending from the top 242 of the base plate 240. The support walls 252 may form a U-shaped channel having two side walls and an end wall between the side walls. The wire channel 250 may have other shapes in alternative embodiments. In an exemplary embodiment, the wire channel 250 may be open at the front with the defroster wire 216 extending from the front of the wire channel 250. Optionally, the wire channel 250 may be open at the top of the support walls 252, such as to receive the defroster wire 216 through the open top. The wire channel 250 positions the defroster wire 216 within the housing 210, such as such as for termination to the inductor 212. In the illustrated embodiment, the wire channel 250 is located proximate to a front 254 of the base plate 240. The wire channel 250 may be located proximate to a first side 256 of the base plate 240. Alternatively, the wire channel 250 may be located proximate to a second side 258 of the base plate 240 or may be approximately centered between the first and second sides 256, 258. Other locations are possible in alternative embodiments, such as proximate to a rear 255 of the base plate 240.

The housing 210 includes an inductor pocket 260 along the top 242 of the base plate 240. The inductor pocket 260 receives the inductor 212 of the wavetrap 200. The inductor pocket 260 may be defined by walls 262 extending from the top 242 that engage and support the inductor 212 to position the inductor 212 within the housing 210. In the illustrated embodiment, the inductor pocket 260 is located proximate to the front 254 of the base plate 240. Other locations are possible in alternative embodiments. Optionally, the inductor pocket 260 may extend between the first side 256 and the second side 258 such that the inductor 212 is arranged along an axis generally parallel to the front 254.

In an exemplary embodiment, the inductor 212 includes a coil 264 extending between a first end 266 and a second end 268. The first end 266 of the inductor 212 may extend into the wire channel 250 for termination to the wire end 218 of the defroster wire 216. The second end 268 of the inductor 212 extend into another portion of the housing 210 for electrical connection to another component of the wavetrap 200. In an exemplary embodiment, the first end 266 directly engages the wire end 218 of the defroster wire 216 within the wire channel 250. The first end 266 may be soldered to the wire end 218. In various embodiments, the first end 266 and the wire end 218 may be stacked within the wire channel 250, such as with the first end 266 located above the wire end 218. In other various embodiments, the first end 266 and the wire end 218 may be arranged side-by-side. The first end 266 may be supported in the wire channel 250 by the support walls 252. The first end 266 may be received into the wire channel 250 through the open top or the open front of the wire channel 250. The support walls 252 may hold the first end 266 and/or the wire end 218 by a compression or interference fit.

The housing 210 includes a capacitor pocket 270 along the top 242 of the base plate 240. The capacitor pocket 270 receives the capacitor 214 of the wavetrap 200. The capacitor pocket 270 may be defined by walls 272 extending from the top 242 that engage and support the capacitor 214 to position the capacitor 214 within the housing 210. In the illustrated embodiment, the capacitor pocket 270 is located proximate to the rear 255 of the base plate 240. Other locations are possible in alternative embodiments. Optionally, the capacitor pocket 270 may extend between the first side 256 and the second side 258 such that the capacitor 214 is arranged along an axis generally parallel to the rear 255. Optionally, multiple capacitors 214 may be arranged within the capacitor pocket 270, such as a high-frequency capacitor and a low-frequency capacitor.

In an exemplary embodiment, the capacitor 214 includes a capacitor body 274 having a first wire 276 extending from the capacitor body 274 and a second wire 278 extending from the capacitor body 274. The first and second wires 276, 278 are configured for electrical connection to components of the wavetrap 200. The wires 276, 278 may be solder wires.

The housing 210 includes a terminal pocket 280 configured to receive one or more terminals of the wavetrap 200. In the illustrated embodiment, the wavetrap 200 includes a first terminal 282 and a second terminal 284. The first terminal 282 defines the ground conductor 204 and may be referred to hereinafter as a ground terminal 282. The second terminal 284 defines the battery conductor 206 and may be referred to hereinafter as a battery terminal 284. In an exemplary embodiment, the first terminal 282 is received in a first terminal pocket region 280a of the terminal pocket 280 and the second terminal 284 is received in a second terminal pocket region 280b of the terminal pocket 280. In the illustrated embodiment, the terminal pocket 280 is located between the inductor pocket 260 and the capacitor pocket 270. As such, the inductor 212 may be electrically connected to the second terminal 284 in the terminal pocket 280 and the capacitor 214 may be electrically connected to the terminals 282, 284 in the terminal pocket 280. Other locations are possible in alternative embodiments. In the illustrated embodiment, the first terminal pocket region 280a is located proximate to the first side 256 and the second terminal pocket region 280b is located proximate to the second side 258. Other positions are possible in alternative embodiments.

The housing 210 includes locating features to locate the terminals 282, 284 in the terminal pocket 280. In the illustrated embodiment, the housing 210 includes locating walls 286 extending from the top 242 of the base plate 240 into the terminal pocket 280 to engage and locate the terminals 282, 284 within the terminal pocket 280. The locating walls 286 may engage one or more edges of the terminals 282, 284 to locate the terminals 282, 284 in the terminal pocket 280. In the illustrated embodiment, the locating walls 286 are L-shaped to engage two perpendicular edges of the corresponding terminals 282, 284, such as at respective corners of the terminals 282, 284. In the illustrated embodiment, the housing 210 includes locating posts 288 extending from the top 242 of the base plate 240 into the terminal pocket 280 to engage and locate the terminals 282, 284 within the terminal pocket 280. The locating posts 288 may have a circular cross-section in various embodiments; however, the locating posts 288 may have other shapes in alternative embodiments, such as a rectangular shape. The locating posts 288 and the locating walls 286 locate the terminals 282, 284 within the terminal pocket 280, such as for electrical connection to other components of the wavetrap 200, such as the inductor 212, the capacitor 214, and the like.

The ground terminal 282 includes a locating opening 290 receiving the corresponding locating post 288. The ground terminal 282 includes a mounting opening 291 that receives the fastener 226. In an exemplary embodiment, the ground terminal 282 is electrically connect to the fastener 226 when the fastener 226 is threadably coupled to the mounting structure and compressed against the ground terminal 282. The ground terminal 282 includes edges 292 configured to engage the locating walls 286 to locate the ground terminal 282 within the terminal pocket 280. The edges 292 extend between a top and a bottom of the ground terminal 282. In an exemplary embodiment, the first wire 276 of the capacitor 214 is soldered to the top of the ground terminal 282. The ground terminal 282 may be electrically connected to the capacitor 214 by other means in alternative embodiments.

The battery terminal 284 includes a locating opening 294 receiving the corresponding locating post 288. The battery terminal 284 includes edges 296 configured to engage the locating walls 286 to locate the battery terminal 284 within the terminal pocket 280. The edges 296 extend between a top and a bottom of the battery terminal 284. In an exemplary embodiment, the second wire 278 of the capacitor 214 is soldered to the top of the battery terminal 284. The battery terminal 284 may be electrically connected to the capacitor 214 by other means in alternative embodiments. In an exemplary embodiment, the second end 268 of the inductor 212 is soldered to the top of the battery terminal 284. The battery terminal 284 may be electrically connected to the inductor 212 by other means in alternative embodiments.

In an exemplary embodiment, the battery terminal 284 includes a terminal tab 298 extending along the mating pad 248. The terminal tab 298 is configured to be electrically connected to the electrical connector 208. For example, the terminal tab 298 may be plugged into the electrical connector 208 when the electrical connector 208 is received in the connector port 236. The terminal tab 298 defines a separable mating interface for mating with the electrical connector 208. In other various embodiments, the terminal tab 298 may be electrically connected to another component, such as a wire defining part of the battery conductor 206 extending from the housing 210 to the battery. For example, the wire may be soldered are welded to the terminal tab 298 or the terminal tab 298 may be formed as a crimp barrel configured to be crimped to the wire.

During assembly of the wavetrap 200, the defroster wire 216 is received in the wire channel 250. The defroster wire 216 extends from the housing 210 for electrical connection to the vehicle defroster circuit 108 (shown in FIG. 1). The battery terminal 284 and the ground terminal 282 are received in the terminal pocket 280 and coupled to the base plate 240, such as using the locating features including the locating walls 286 and the locating posts 288. The fastener 226 is received in the mounting opening 291 and secured to the mounting structure. The ground terminal 282 is electrically grounded, such as to the mounting structure or another grounded circuit, using the fastener 226. The capacitor 214 is received in the capacitor pocket 270. The capacitor 214 is electrically connected to the ground terminal 282 and the battery terminal 284. The inductor 212 is received in the inductor pocket 260. The inductor 212 is electrically connected to the defroster wire 216 in the wire channel 250 and is electrically connected to the battery terminal 284. The cover 222 is coupled to the base 220 to cover the components of the wavetrap 200. The electrical connector 208 may be mated with the wavetrap 200, such as being plugged into the connector port 236. The electrical connector 208 electrically connects the battery terminal 284 to the battery 118 (shown in FIG. 1).

Figure 4:
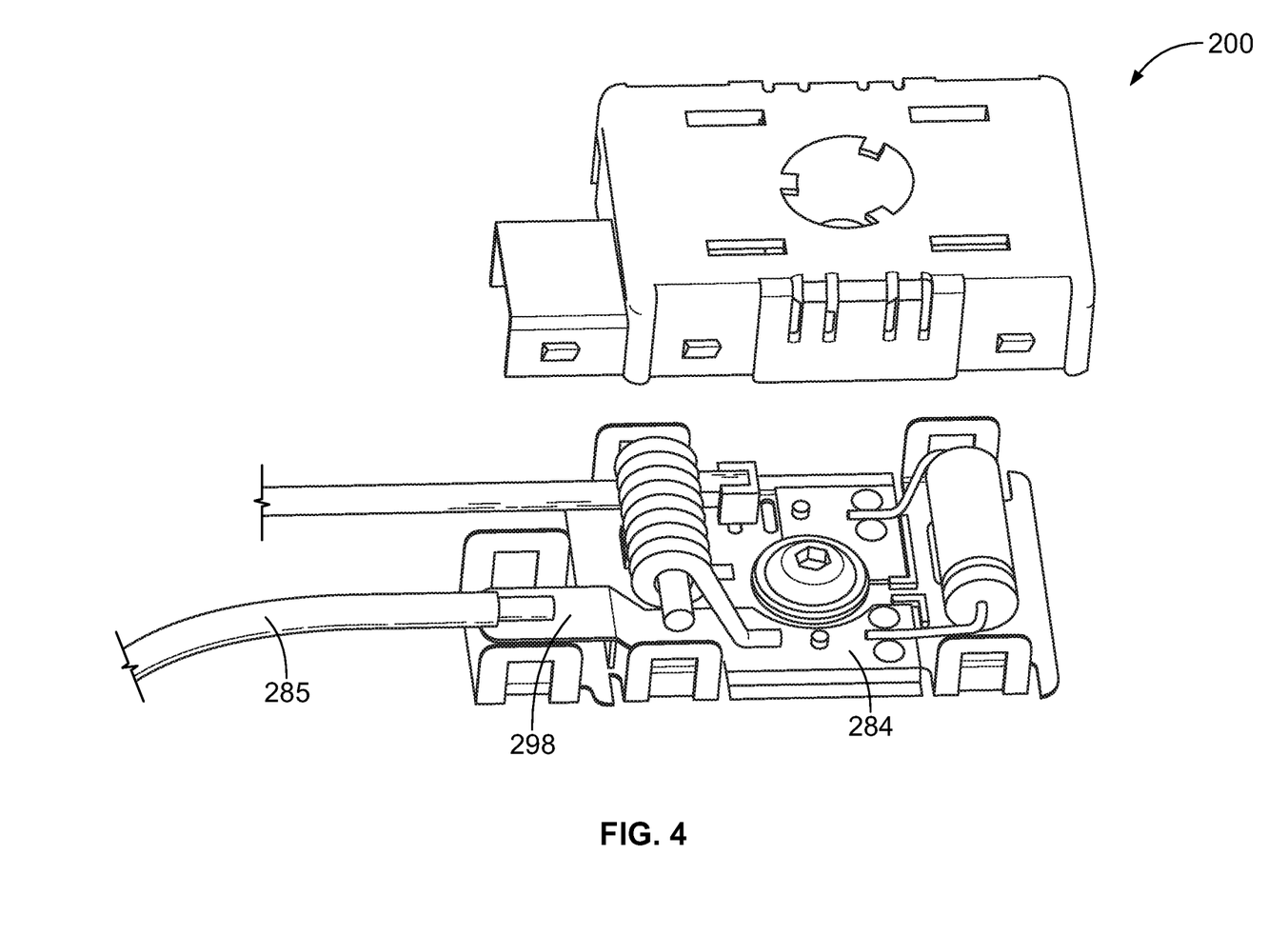
FIG. 4 is a partially exploded perspective view of the wavetrap in accordance with an exemplary embodiment.

FIG. 4 is a partially exploded perspective view of the plus wavetrap 200 in accordance with an exemplary embodiment. In the illustrated embodiment, a battery wire 285 is terminated directly to the terminal tab 298 of the battery terminal 284 rather than terminating the electrical connector 208 (shown in FIG. 3). The battery wire 285 electrically connects the wavetrap 200 to the battery 118 (shown in FIG. 1). The battery wire 285 may be soldered, welded, crimped or otherwise electrically connected to the terminal tab 298. The terminal tab 298 is easily accessible at the front of the plus wavetrap 200 for connection of the battery wire 285 directly to the terminal tab 298.

Figure 5:
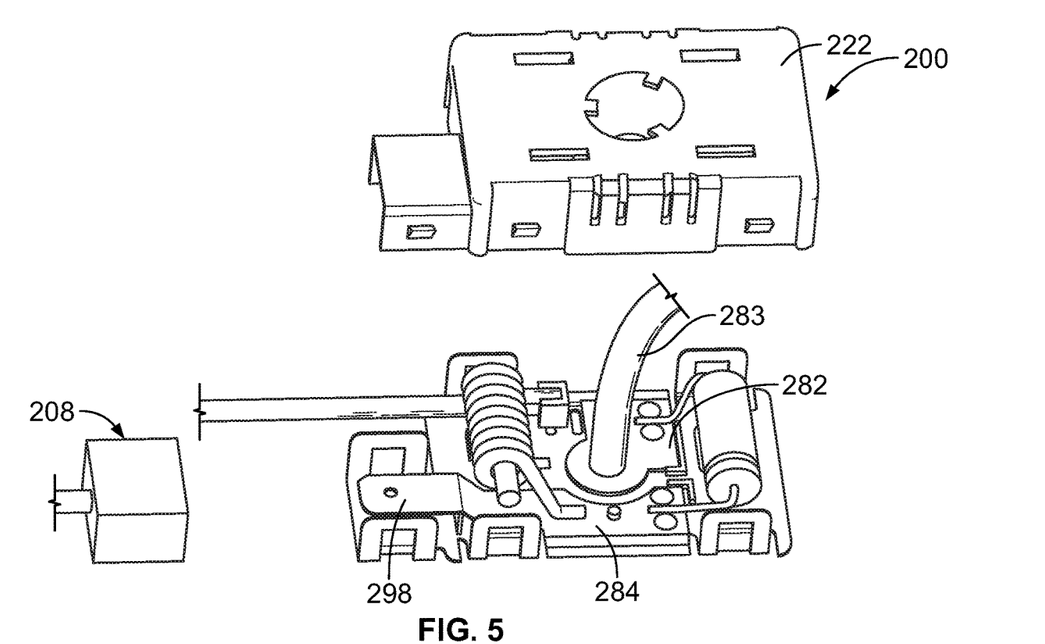
FIG. 5 is a partially exploded perspective view of the wavetrap in accordance with an exemplary embodiment.

FIG. 5 is a partially exploded perspective view of the plus wavetrap 200 in accordance with an exemplary embodiment. FIG. 5 illustrates a ground wire 283 terminated to the ground terminal 282. In the illustrated embodiment, the ground wire 283 is used in lieu of the fastener 226 (shown in FIG. 3) to electrically ground the wavetrap 200. The ground wire 283 may extend through an opening in the cover 222. The ground wire 283 may be soldered, welded, crimped or otherwise electrically connected to the ground terminal 282. FIG. 5 illustrates the electrical connector 208 configured to be coupled to the terminal tab 298 of the battery terminal 284 to electrically connect the wavetrap 200 to the battery 118 (shown in FIG. 1).

Figure 6:
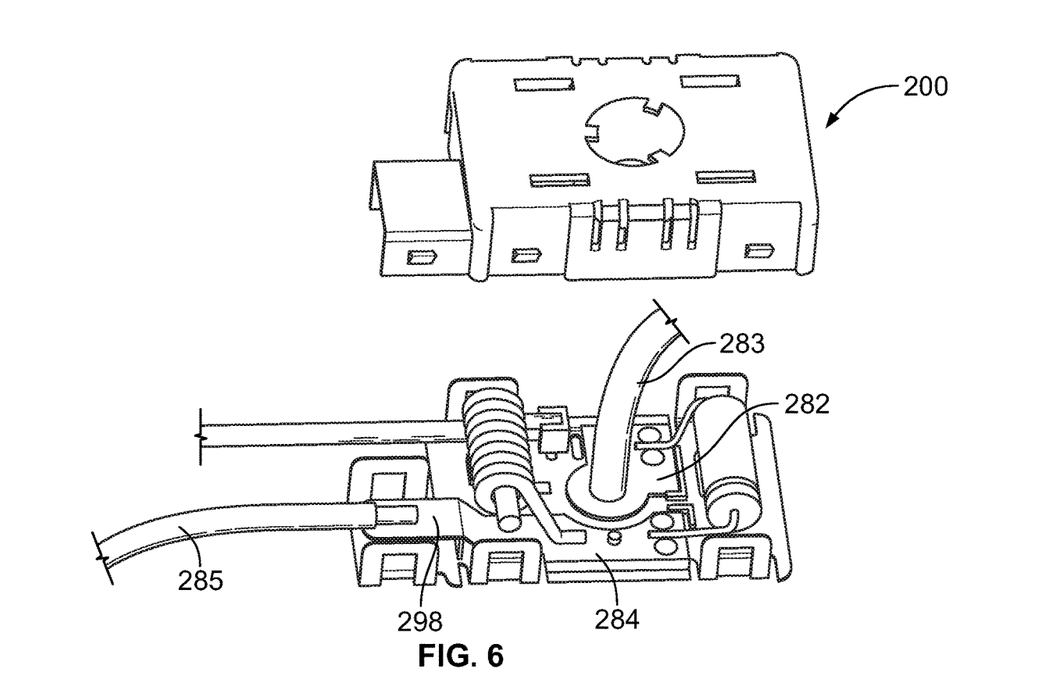
FIG. 6 is a partially exploded perspective view of the wavetrap in accordance with an exemplary embodiment.

FIG. 6 is a partially exploded perspective view of the plus wavetrap 200 in accordance with an exemplary embodiment. FIG. 6 illustrates the ground wire 283 terminated to the ground terminal 282, rather than using the fastener 226 (shown in FIG. 3) to electrically ground the wavetrap 200. FIG. 6 illustrates the battery wire 285 terminated to the terminal tab 298 of the battery terminal 284, rather than using the electrical connector 208 (shown in FIG. 3) to electrically connect the wavetrap 200 to the battery 118 (shown in FIG. 1).

Figure 7:
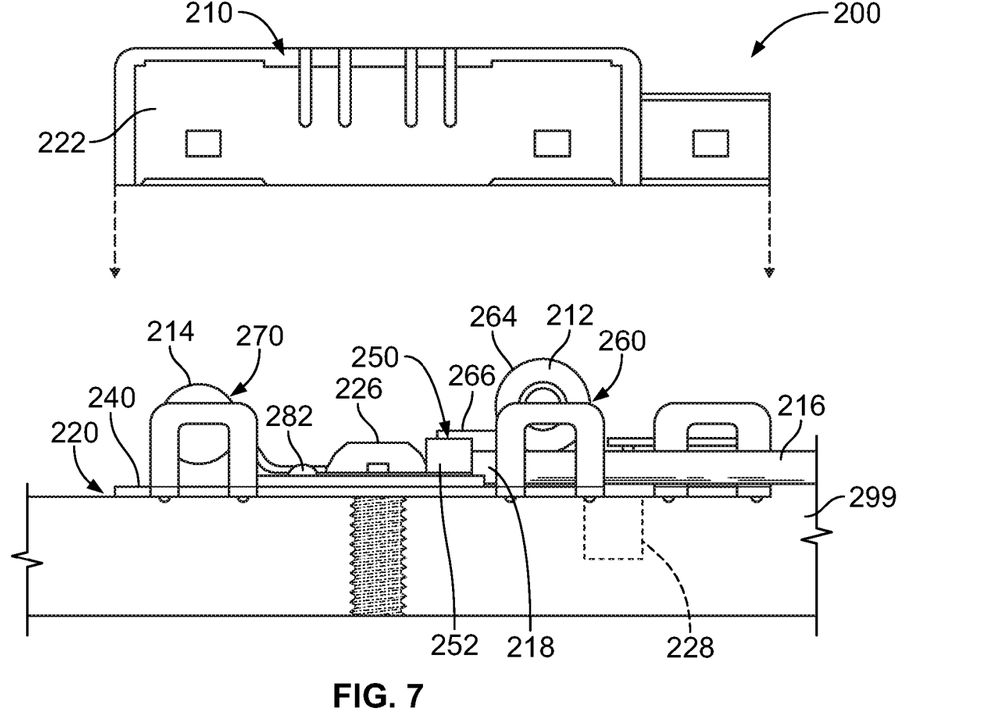
FIG. 7 is a side view of the wavetrap in accordance with an exemplary embodiment.

FIG. 7 is a side view of the plus wavetrap 200 in accordance with an exemplary embodiment. FIG. 7 illustrates the cover 222 poised for mating to the base 220. The fastener 226 is shown extending through the bottom of the base plate 240. The mounting clip 228 is shown extending from the bottom of the base plate 240.

The defroster wire 216 extends into the housing 210 and is received in the wire channel 250. The first end 266 of the coil 264 of the inductor 212 is received in the wire channel 250 and electrically connected to the defroster wire 216. In an exemplary embodiment, the first end 266 directly engages the wire end 218 of the defroster wire 216 within the wire channel 250. The first end 266 may be soldered to the wire end 218. In various embodiments, the first end 266 and the wire end 218 may be stacked within the wire channel 250, such as with the first end 266 located above the wire end 218. In other various embodiments, the first end 266 and the wire end 218 may be arranged side-by-side. The first end 266 may be supported in the wire channel 250 by the support walls 252. The first end 266 may be received into the wire channel 250 through the open top or the open front of the wire channel 250. The support walls 252 may hold the first end 266 and/or the wire end 218 by a compression or interference fit.

The inductor 212 is illustrated in the inductor pocket 260. The capacitor 214 is illustrated in the capacitor pocket 270. The fastener 226 is illustrated coupled to the ground terminal 282 and threadably coupled to a mounting structure 299. The mounting structure 299 may be a chassis or other electrically grounded component of the vehicle. The mounting clip 228 is coupled to the mounting structure 299 to position the base 220 of the housing 210 relative to the mounting structure 299 prior to coupling the fastener 226 to the mounting structure 299.

Figure 8:
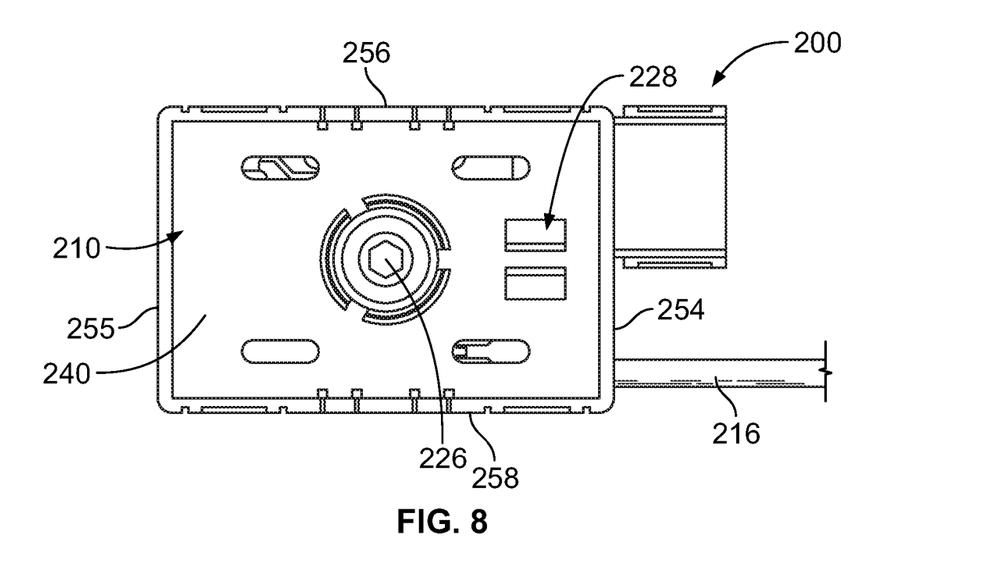
FIG. 8 is a bottom view of the wavetrap in accordance with an exemplary embodiment.

FIG. 8 is a bottom view of the plus wavetrap 200 in accordance with an exemplary embodiment. FIG. 8 illustrates the bottom of the base plate 240. The fastener 226 is shown extending through the bottom of the base plate 240. The mounting clip 228 is shown extending from the bottom of the base plate 240. The defroster wire 216 of the wavetrap 200 is shown extending from the front 254 of the housing 210; however, the defroster wire 216 may extend from other areas of the housing 210, such as the sides 256, 258, the rear 255, the bottom or the top.

Figure 9:
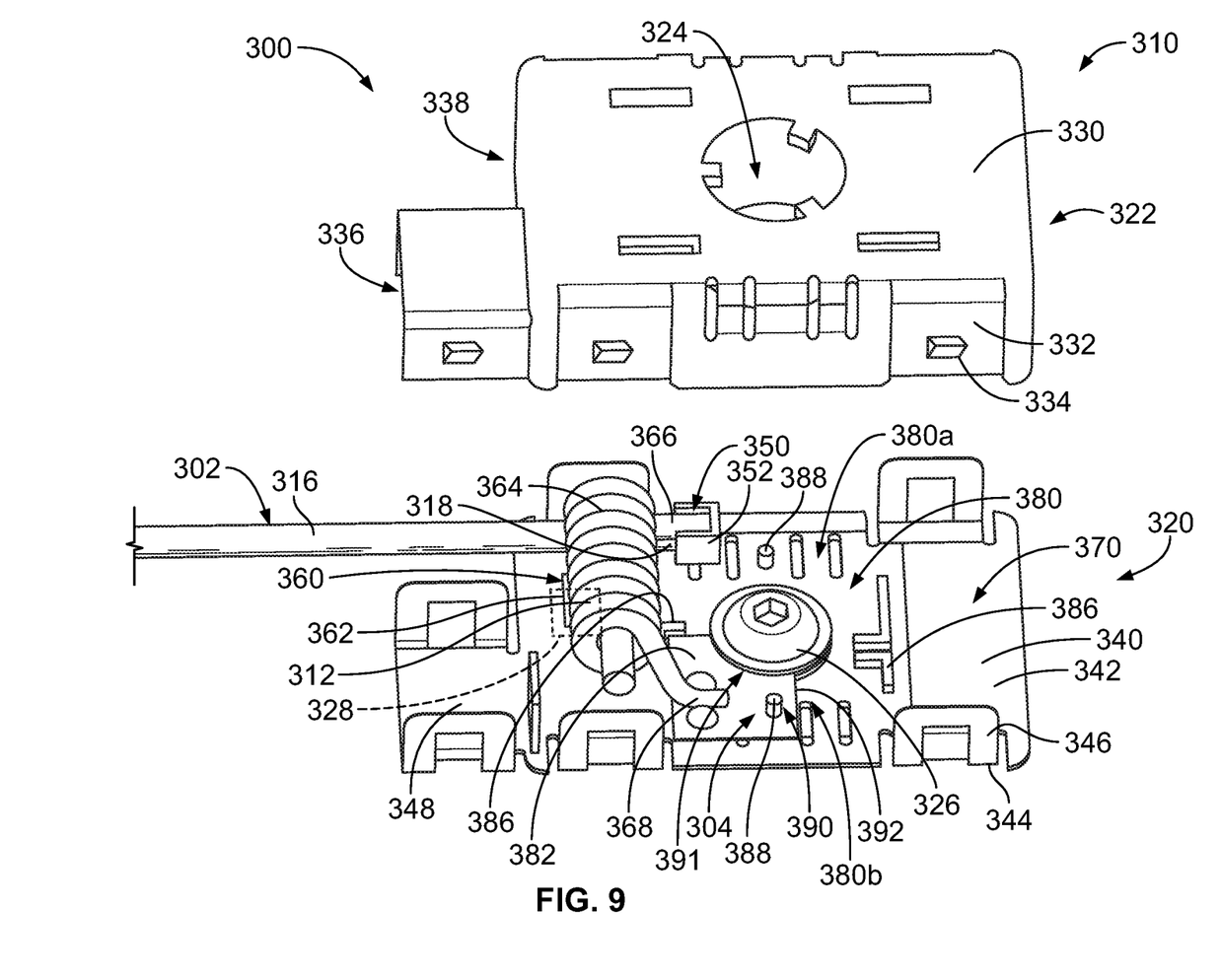
FIG. 9 is a partially exploded perspective view of a wavetrap of the wavetrap system in accordance with an exemplary embodiment.

FIG. 9 is a partially exploded perspective view of the minus wavetrap 300 in accordance with an exemplary embodiment. The minus wavetrap 300 is similar to the plus wavetrap 200 (shown in FIG. 3) and utilizes common parts and components as the plus wavetrap 200. The wavetrap 300 includes the housing 310 holding various components of the wavetrap system. In an exemplary embodiment, the housing 310 is a multi-piece housing having a base 320 and a cover 322 configured to be coupled to the base 320. The cover 322 includes a cavity 324 that receives the components of the wavetrap 300 when the cover 322 is coupled to the base 320. The base 320 holds components of the wavetrap 300. In an exemplary embodiment, the housing 310 is identical to the housing 210 (FIG. 3), with the base 320 being identical to the base 220 and the cover 322 being identical to the cover 222. The base 320 is configured to be mounted to a mounting structure using a fastener 326, such as a threaded fastener; however, the base may be secured to the mounting structure by other means, such as adhesive, clips or other types of fasteners. In various embodiments, the base 320 includes a mounting clip 328 (shown in phantom) for locating and/or securing the base 320 to the mounting structure.

The cover 322 includes a top 330 and side walls 332 extending from the top 330. The cavity 324 is defined by the top 330 and the side walls 332. The cavity 324 is open at the bottom of the cover 322. In an exemplary embodiment, the side walls 332 include latching features 334 for latchably securing the cover 322 to the base 320. In an exemplary embodiment, the cover 322 includes a connector port 336 at the front. In an exemplary embodiment, the cover 322 includes one or more wire ports 338 to receive wires of the wavetrap 300.

The base 320 includes a base plate 340 having a top 342 and a bottom 344. In an exemplary embodiment, the base plate 340 is identical to the base plate 240 (shown in FIG. 3). The base plate 340 positions and holds the components of the wavetrap 300. In an exemplary embodiment, the base 320 includes latching features 346 extending from the base plate 340. The latching features 346 interface with the latching features 334 of the cover 322 to secure the cover 322 to the base 320. In an exemplary embodiment, the base plate 340 includes a mating pad 348. The mating pad 348 is an extension extend from the front of the base plate 340.

The wavetrap 300 includes a defroster wire 316 extending into the housing 310. In an exemplary embodiment, the defroster wire 316 is identical to the defroster wire 216 (shown in FIG. 3). In the illustrated embodiment, the defroster wire 316 defines the defroster conductor 302 of the wavetrap 300. The defroster wire 316 extends to a wire end 318. The wire end 318 is terminated to the inductor 312. In an exemplary embodiment, the housing 310 includes a wire channel 350 receiving the wire end 318 of the defroster wire 316. The wire channel 350 is formed by support walls 352 extending from the top 342 of the base plate 340. The support walls 352 may form a U-shaped channel having two side walls and an end wall between the side walls. The wire channel 350 may have other shapes in alternative embodiments. In an exemplary embodiment, the wire channel 350 may be open at the front with the defroster wire 316 extending from the front of the wire channel 350. Optionally, the wire channel 350 may be open at the top of the support walls 352, such as to receive the defroster wire 316 through the open top. The wire channel 350 positions the defroster wire 316 within the housing 310, such as such as for termination to the inductor 312.

The housing 310 includes an inductor pocket 360 along the top 342 of the base plate 340. In an exemplary embodiment, the inductor pocket 360 is identical to the inductor pocket 260 (shown in FIG. 3). The inductor pocket 360 receives the inductor 312 of the wavetrap 300. The inductor pocket 360 may be defined by walls 362 extending from the top 342 that engage and support the inductor 312 to position the inductor 312 within the housing 310. In an exemplary embodiment, the inductor 312 is identical to the inductor 212 (shown in FIG. 3). The inductor 312 includes a coil 364 extending between a first end 366 and a second end 368. The first end 366 of the inductor 312 may extend into the wire channel 350 for termination to the wire end 318 of the defroster wire 316. The second end 368 of the inductor 312 extend into another portion of the housing 310 for electrical connection to another component of the wavetrap 300.

The housing 310 includes a capacitor pocket 370 along the top 342 of the base plate 340. In an exemplary embodiment, the capacitor pocket 370 is identical to the capacitor pocket 270 (shown in FIG. 3). In the illustrated embodiment, the wavetrap 300 is devoid of a capacitor, rather the capacitor is included as part of the wavetrap 200. However, because the housing 310 is identical to the housing 210, the housing 310 includes the capacitor pocket 370. The capacitor pocket 370 may receive other components of the wavetrap 300.

The housing 310 includes a terminal pocket 380 configured to receive one or more terminals of the wavetrap 300. In an exemplary embodiment, the terminal pocket 380 is identical to the terminal pocket 280 (shown in FIG. 3). In an exemplary embodiment, the terminal pocket 380 includes a first terminal pocket region 380a and a second terminal pocket region 380b of the terminal pocket 380, both configured to receive a terminal 382 of the wavetrap 300.

The housing 310 includes locating features to locate the terminal 382 in the terminal pocket 380. In the illustrated embodiment, the housing 310 includes locating walls 386 extending from the top 342 of the base plate 340 into the terminal pocket 380 to engage and locate the terminal 382 within the terminal pocket 380. In the illustrated embodiment, the housing 310 includes locating posts 388 extending from the top 342 of the base plate 340 into the terminal pocket 380 to engage and locate the terminal 382 within the terminal pocket 380. The locating posts 388 and the locating walls 386 locate the terminal 382 within the terminal pocket 380 for electrical connection to other components of the wavetrap 300, such as the inductor 312, a ground component, such as the fastener 226, a ground wire, and the like.

In an exemplary embodiment, the terminal 382 defines the ground conductor 304 and may be referred to hereinafter as a ground terminal 382. The terminal 382 may be identical to the first terminal 282 (shown in FIG. 3) in various embodiments or the terminal 382 may be identical to the second terminal 284 (shown in FIG. 3) in other various embodiments (see, for example, FIG. 11). The terminal 382 is identical to the first terminal 282 or the second terminal 284 to utilize identical components throughout the wavetrap system 120 (shown in FIG. 1) and thus reduce the part count and tooling cost of producing the wavetrap system 120.

The ground terminal 382 includes a locating opening 390 receiving the locating post 388. The ground terminal 382 includes a mounting opening 391 that receives the fastener 326. In an exemplary embodiment, the ground terminal 382 is electrically connect to and grounded by the fastener 326. The ground terminal 382 includes edges 392 configured to engage the locating walls 386 to locate the ground terminal 382 within the terminal pocket 380.

In the illustrated embodiment, the ground terminal 382 is identical to the first terminal 282. However, the ground terminal 382 is located in the second terminal pocket region 380b. In comparison with reference back to FIG. 3, the first terminal 282 is located in the first terminal pocket region 280a. For instance, the first terminal 282 is in a first orientation in the first terminal pocket region 280a and the ground terminal 382 is in a second orientation in the second terminal pocket region 380b (for example, rotated 180° relative to the first orientation). The same terminal 382 is configured to be located in different regions on the terminal pocket 380 using the various locating features (for example, the locating walls 386 and the locating posts 388.

During assembly of the wavetrap 300, the defroster wire 316 is received in the wire channel 350. The defroster wire 316 extends from the housing 310 for electrical connection to the vehicle defroster circuit 108 (shown in FIG. 1). The ground terminal 382 is received in the terminal pocket 380 and coupled to the base plate 340, such as using the locating features including the locating walls 386 and the locating posts 388. The fastener 326 is received in a mounting opening 391 of the ground terminal 382 and secured to the mounting structure. The ground terminal 382 is electrically grounded to the mounting structure or another grounded circuit using the fastener 326. The inductor 312 is received in the inductor pocket 360. The inductor 312 is electrically connected to the defroster wire 316 in the wire channel 350 and is electrically connected to the ground terminal 382. The inductor 312 is terminated to the ground terminal 382. The cover 322 is coupled to the base 320 to cover the components of the wavetrap 300.

Figure 10:
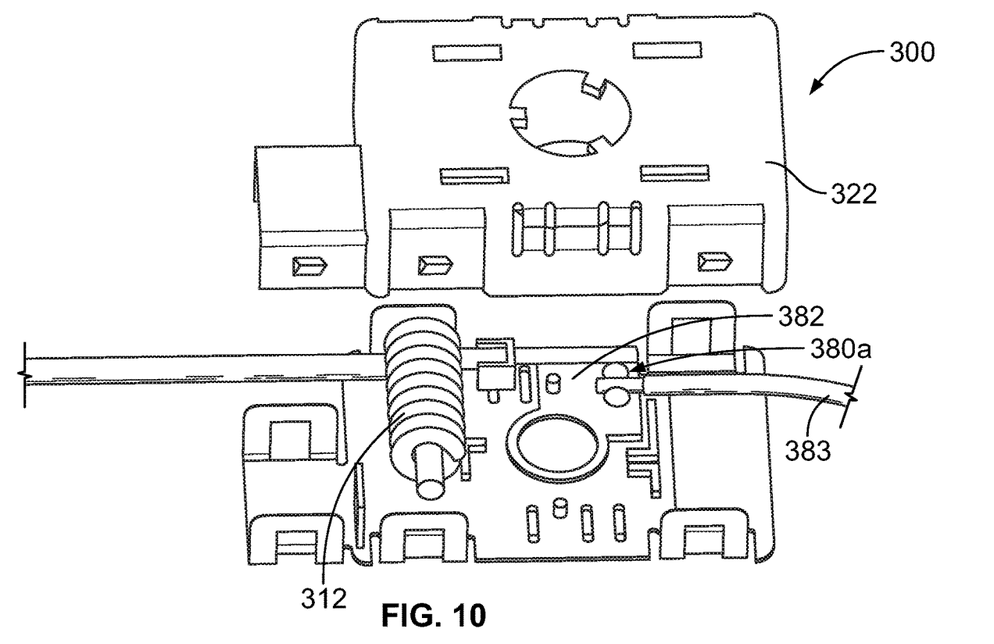
FIG. 10 is a partially exploded perspective view of the wavetrap in accordance with an exemplary embodiment.

FIG. 10 is a partially exploded perspective view of the minus wavetrap 300 in accordance with an exemplary embodiment. FIG. 10 illustrates the ground terminal 382 in the first orientation received in the first terminal pocket region 380a, identical to the orientation of the first terminal 282 in the first terminal pocket region 280a of the housing 210 (shown in FIG. 3). FIG. 10 illustrates a ground wire 383 terminated to the ground terminal 382. In the illustrated embodiment, the ground wire 383 is used in lieu of the fastener 326 (shown in FIG. 9) to electrically ground the wavetrap 300. The ground wire 383 may extend through an opening in the cover 322. The ground wire 383 may be soldered, welded, crimped or otherwise electrically connected to the ground terminal 382. The inductor 312 is terminated to the ground terminal 382. The ground wire 383 is electrically connected to the inductor 312 through the ground terminal 382.

Figure 11:
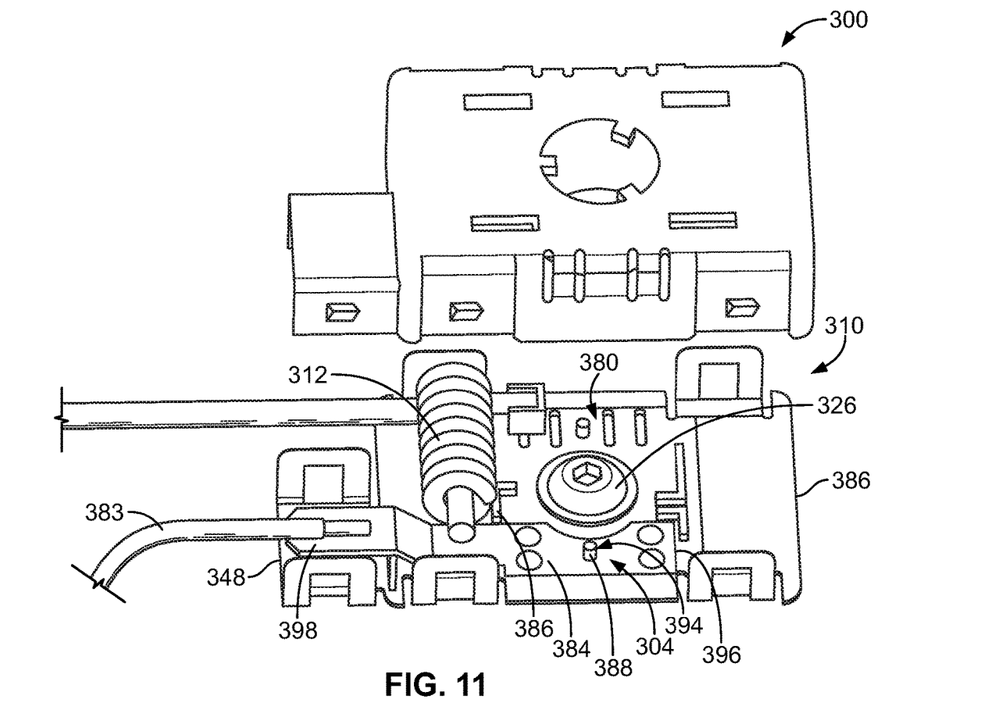
FIG. 11 is a partially exploded perspective view of the wavetrap in accordance with an exemplary embodiment.

FIG. 11 is a partially exploded perspective view of the minus wavetrap 300 in accordance with an exemplary embodiment. FIG. 11 illustrates the wavetrap 300 with a terminal 384. The terminal 384 defines the ground conductor 304 and may be referred to hereinafter as a ground terminal 384. The terminal 384 may be identical to the second terminal 284 (shown in FIG. 3) to utilize identical components throughout the wavetrap system 120 (shown in FIG. 1) and thus reduce the part count and tooling cost of producing the wavetrap system 120.

The ground terminal 384 includes a locating opening 394 receiving the locating post 388. The ground terminal 384 includes edges 396 configured to engage the locating walls 386 to locate the ground terminal 384 within the terminal pocket 380. The ground terminal 384 includes a terminal tab 398 extending along the mating pad 348. The terminal tab 298 is electrically connected to a grounded component by a ground wire 383 extending from the housing 310. For example, the ground wire 383 may be soldered are welded to the terminal tab 398 or the terminal tab 398 may be formed as a crimp barrel configured to be crimped to the ground wire 383. The inductor 312 is terminated to the ground terminal 384. The ground wire 383 is electrically connected to the inductor 312 through the ground terminal 384. The fastener 326 is used to secure the wavetrap 300 to the mounting structure but is not part of the grounding circuit.

Figure 12:
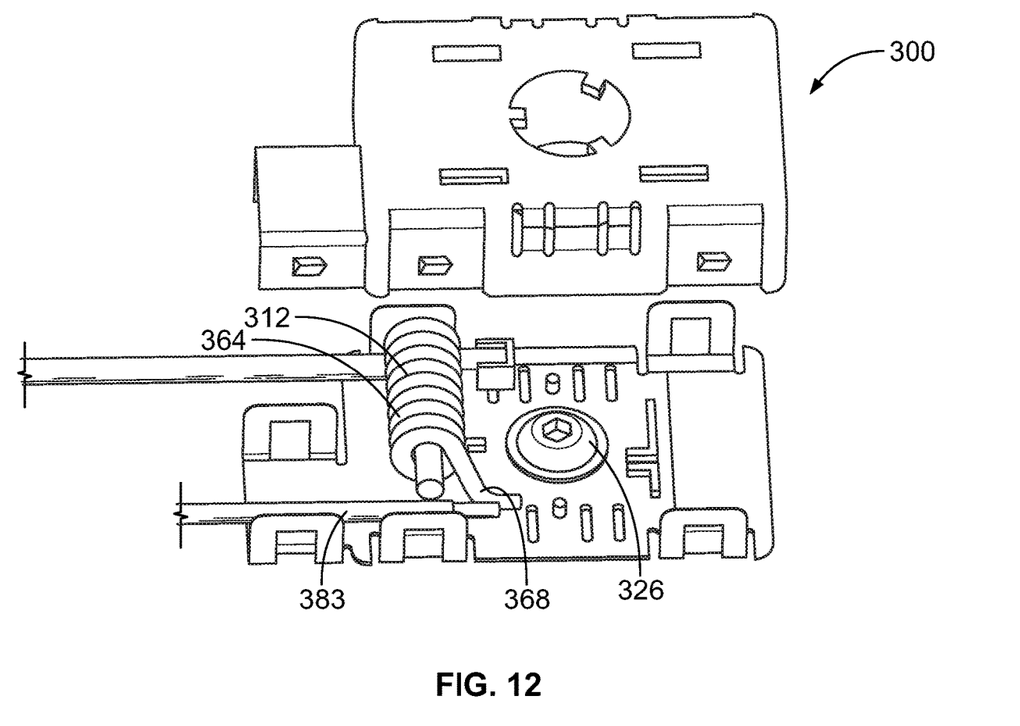
FIG. 12 is a partially exploded perspective view of the wavetrap in accordance with an exemplary embodiment.

FIG. 12 is a partially exploded perspective view of the minus wavetrap 300 in accordance with an exemplary embodiment. FIG. 12 illustrates the ground wire 383 terminated directly to the second end 368 of the coil 364 of the inductor 312 rather than using a ground terminal, such as the ground terminal 382 (FIG. 9) or the ground terminal 384 (FIG. 11). The fastener 326 is used to secure the wavetrap 300 to the mounting structure but is not part of the grounding circuit.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A wavetrap comprising:
a housing having a base including a base plate, the base plate having a top, the housing having a wire channel above the top of the base plate formed by a support wall, the housing having an inductor pocket above the top of the base plate formed by an inductor pocket wall, the housing having a terminal pocket above the top of the base plate formed by a terminal pocket wall, the housing having a capacitor pocket above the top of the base plate formed by a capacitor pocket wall, the capacitor pocket configured to receive a capacitor;
a defroster wire having a wire end received in the wire channel and located in the wire channel by the support wall, the defroster wire configured to extend from the housing for connection to a vehicle defroster circuit;
an inductor supported by the base plate, the inductor received in the inductor pocket and located in the inductor pocket by the inductor pocket wall, the inductor having a coil extending between a first end and a second end, the first end being coupled to the wire end of the defroster wire; and
a ground terminal supported by the base plate, the ground terminal received in the terminal pocket and located in the terminal pocket by the terminal pocket wall, the ground terminal being electrically connected to a ground circuit.

2. The wavetrap of claim 1, wherein the first end of the inductor extends into the wire channel for termination to the wire end of the defroster wire.

3. The wavetrap of claim 1, wherein the second end of the coil of the inductor is terminated to the ground terminal.

4. The wavetrap of claim 1, wherein the ground terminal is electrically connected to the ground circuit by a screw fastener.

5. The wavetrap of claim 1, wherein the ground terminal is electrically connected to the ground circuit by a ground wire extending from the housing.

6. The wavetrap of claim 1, wherein the housing includes a cover coupled to the base, the cover having a cavity receiving the defroster wire, the inductor, and the ground terminal.

7. The wavetrap of claim 1, wherein the base includes a mounting clip extending from a bottom of the base plate for mounting the base plate to a mounting structure.

8. The wavetrap of claim 1, wherein the housing includes a second terminal pocket, the ground terminal being variably positionable within the housing between a first orientation and a second orientation, the ground terminal being receivable in the terminal pocket in the first orientation and the ground terminal being receivable in the second terminal pocket in the second orientation, the second end of the coil of the inductor being terminated to the ground terminal when the ground terminal is in the second orientation and received in the second terminal pocket.

9. The wavetrap of claim 8, wherein the housing includes a first locating feature in the terminal pocket and a second locating feature in the second terminal pocket, the ground terminal engaging the first locating feature when in the first orientation and received in the terminal pocket, the ground terminal engaging the second locating feature when in the second orientation and received in the second terminal pocket.

10. The wavetrap of claim 8, further comprising a battery terminal receivable in the second terminal pocket, the second end of the coil of the inductor being terminated to the battery terminal when the battery terminal is received in the second terminal pocket, the battery terminal being electrically connected to a battery circuit.

11. The wavetrap of claim 10, further comprising a capacitor received in the capacitor pocket, the capacitor being electrically connected to the ground terminal, the capacitor being electrically connected to the battery terminal.

12. The wavetrap of claim 10, wherein the battery terminal includes a terminal tab having a separable mating interface.

13. The wavetrap of claim 10, further comprising a battery wire terminated to the battery terminal, the battery wire extending from the housing.

14. A wavetrap system comprising:
a plus wavetrap configured to be electrically connected to a positive side of a vehicle defroster circuit and a minus wavetrap configured to be electrically connected to a negative side of the vehicle defroster circuit;
the plus wavetrap comprising a first housing having a first base including a first base plate, the first housing having a first wire channel, the first housing having a first inductor pocket, the first housing having a first terminal pocket, the first housing having a first capacitor pocket, the plus wavetrap comprising a first defroster wire having a wire end received in the first wire channel, the first defroster wire configured to extend from the first housing for connection to the positive side of the vehicle defroster circuit, the plus wavetrap comprising a first inductor received in the first inductor pocket, the first inductor having a first coil extending between a first end and a second end, the first end of the first coil being coupled to the wire end of the first defroster wire, the plus wavetrap comprising a first battery terminal received in the first terminal pocket, the first battery terminal being electrically connected to a battery, the second end of the first coil being terminated to the first battery terminal, the plus wavetrap comprising a first ground terminal received in the first terminal pocket, the first ground terminal being electrically connected to a ground circuit, the plug wavetrap comprising a first capacitor received in the first capacitor pocket, the first capacitor being electrically connected to the first battery terminal, the first capacitor being electrically connected to the first ground terminal; and
the minus wavetrap comprising a second housing having a second base including a second base plate, the second housing having a second wire channel, the second housing having a second inductor pocket, the second housing having a second terminal pocket, the second housing having a second capacitor pocket, the minus wavetrap comprising a second defroster wire having a wire end received in the second wire channel, the second defroster wire configured to extend from the second housing for connection to the negative side of the vehicle defroster circuit, the minus wavetrap comprising a second inductor received in the second inductor pocket, the second inductor having a second coil extending between a first end and a second end, the first end of the second coil being coupled to the wire end of the second defroster wire, the minus wavetrap comprising a second ground terminal received in the second terminal pocket, the second ground terminal being electrically connected to a ground circuit.

15. The wavetrap system of claim 14, wherein the first housing is identical to the second housing.

16. The wavetrap system of claim 14, wherein the second ground terminal is identical to the first ground terminal.

17. The wavetrap system of claim 14, wherein the second ground terminal is identical to the first battery terminal.

18. The wavetrap system of claim 14, wherein the second capacitor pocket is empty and devoid of a capacitor.

19. The wavetrap system of claim 14, wherein the first housing is identical to the second housing, wherein the first inductor is identical to the second inductor, and wherein the second ground terminal is identical to one of the first ground terminal or the first battery terminal.

20. A vehicle defroster system comprising:
a vehicle defroster circuit having a positive circuit at a positive side of the vehicle defroster circuit and a negative circuit at a negative side of the vehicle defroster circuit;
a plus wavetrap electrically connected to the positive side of a vehicle defroster circuit, the plus wavetrap comprising a first housing having a first base including a first base plate, the first housing having a first wire channel, the first housing having a first inductor pocket, the first housing having a first terminal pocket, the first housing having a first capacitor pocket, the plus wavetrap comprising a first defroster wire having a first wire end received in the first wire channel, the first defroster wire configured to extend from the first housing for connection to the positive side of the vehicle defroster circuit, the plus wavetrap comprising a first inductor received in the first inductor pocket, the first inductor having a first coil extending between a first end and a second end, the first end of the first coil being coupled to the first wire end of the first defroster wire, the plus wavetrap comprising a first ground terminal received in the first terminal pocket, the first ground terminal being electrically connected to a ground circuit; and
a minus wavetrap electrically connected to the negative side of the vehicle defroster circuit, the minus wavetrap comprising a second housing having a second base including a second base plate, the second housing having a second wire channel, the second housing having a second inductor pocket, the second housing having a second terminal pocket, the second housing having a second capacitor pocket, the minus wavetrap comprising a second defroster wire having a second wire end received in the second wire channel, the second defroster wire configured to extend from the second housing for connection to the positive side of the vehicle defroster circuit, the minus wavetrap comprising a second inductor received in the second inductor pocket, the second inductor having a second coil extending between a first end and a second end, the second end of the second coil being coupled to the second wire end of the second defroster wire, the minus wavetrap comprising a second ground terminal received in the second terminal pocket, the second ground terminal being electrically connected to a ground circuit.

* * * * *